US011265198B1

(12) United States Patent
Bonen

(10) Patent No.: US 11,265,198 B1
(45) Date of Patent: *Mar. 1, 2022

(54) INCREASING ADC DYNAMIC RANGE BY TIME DOMAIN SELECTIVE CANCELLATION OF PREDICTABLE LARGE PAPR SIGNALS

(71) Applicant: Harmonic, Inc., San Jose, CA (US)

(72) Inventor: Adi Bonen, Belle Mead, NJ (US)

(73) Assignee: Harmonic, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/152,556

(22) Filed: Jan. 19, 2021

Related U.S. Application Data

(63) Continuation of application No. 16/376,581, filed on Apr. 5, 2019, now Pat. No. 10,897,387.

(60) Provisional application No. 62/662,643, filed on Apr. 25, 2018.

(51) Int. Cl.
*H04L 27/26* (2006.01)
*H04B 1/04* (2006.01)
*H04L 27/00* (2006.01)
*H04H 20/78* (2008.01)

(52) U.S. Cl.
CPC ....... *H04L 27/2614* (2013.01); *H04B 1/0475* (2013.01); *H04H 20/78* (2013.01); *H04L 27/0008* (2013.01); *H04L 27/2627* (2013.01)

(58) Field of Classification Search
CPC ............ H04L 27/2614; H04L 27/0008; H04L 27/2627; H04B 1/0475; H04H 20/78
USPC ........................................ 375/296
See application file for complete search history.

(56) References Cited

U.S. PATENT DOCUMENTS

| 8,362,936 B2 * | 1/2013 | Ledzius | H03M 1/70 |
| | | | 341/139 |
| 9,735,799 B1 * | 8/2017 | Nguyen | H03M 3/51 |
| 2014/0355697 A1 * | 12/2014 | Magin | H04L 1/004 |
| | | | 375/257 |

* cited by examiner

*Primary Examiner* — Wednel Cadeau
(74) *Attorney, Agent, or Firm* — Brokaw Patent Law PC; Christopher J. Brokaw

(57) ABSTRACT

Increasing an analog to digital converter (ADC) dynamic range for a communications device. In the communications device, a reference threshold is established for a peak to average power ratio (PAPR) improvement factor for RF signals received by the communications device. A digital to analog converter (DAC) adjustment factor is established for a DAC to account for inaccuracies of a pre-cancellation DAC and fine tuning of an analog gain of received RF signals. A peak amplitude separation element evaluates an absolute value of a portion of a particular RF signal against the reference threshold. Upon the peak amplitude separation element determining that the portion is smaller than the reference threshold, the element assigns a zero value to a DAC signal current sample; otherwise, the element assigns a quantized value of the sample to the DAC signal current sample, used in adjusting a post-cancellation signal sample.

20 Claims, 12 Drawing Sheets

INCREASING ADC DYNAMIC RANGE BY TIME DOMAIN SELECTIVE CANCELLATION OF PREDICTABLE LARGE PAPR SIGNALS

CLAIM OF PRIORITY

The present application is a continuation of, and claims priority to, U.S. Non-Provisional patent application Ser. No. 16/376,581, entitled 'Increasing ADC Dynamic Range by Time Domain Selective Cancellation of Predictable Large PAPR Signals,' invented by Adi Bonen, filed on Apr. 5, 2019, issued on Jan. 19, 2021 as U.S. Pat. No. 10,897,387, the entire disclosure of which is hereby incorporated by reference in its entirety for all purposes as if fully set forth herein.

U.S. Pat. No. 10,897,387 claims priority to U.S. Provisional Patent Application No. 62/662,643, entitled 'Increasing ADC Dynamic Range by Time Domain Selective Cancellation of Predictable Large PAPR Signals,' invented by Adi Bonen, filed on Apr. 25, 2018, the entire disclosure of which is hereby incorporated by reference in its entirety for all purposes as if fully set forth herein.

FIELD OF THE INVENTION

Embodiments of the invention generally relate to increasing an analog to digital converter (ADC) dynamic range for a communication device.

BACKGROUND

In a typical communications device, the peak voltage of a pure continuous wave (CW) signal is only $\sqrt{2}$ higher than its average (root mean square or RMS) voltage, exhibiting PAPR (peak to average power ratio, expressed in dB) of 3 dB. A signal composed of N independent equal amplitude CW's has a maximum peak value of $N \times \sqrt{2}$ of the average value of one CW, and an RMS value of $\sqrt{N}$ times the single CW average value. Thus, the maximum PAPR of that signal is $20 \times \log 10(N \times \sqrt{(2/N)}) = 10 \times \log 10(N) + 3$ dB. PAPR increases logarithmically with the number of CW's.

The probability for encountering the high peak value is extremely small. For example, if N=30, the max PAPR could be ~18 dB, but the probability that the peak of all independent CWs will align within ±5 degrees is $(10/360)^{30} = 2 \times 10^{-47}$.

When a RF signal is composed of multiple QAM carriers, the same equation can be used by using a single QAM carrier PAPR to replace the 3 dB of a CW PAPR. In order to quantify a "reasonable to occur" PAPR value, an evaluation of the rate at which the signal is sampled vs. the expected wait time is performed. For example, at a sample rate of 5 Gsps, $5 \times 10^9$ samples will be taken every second, making it very likely that a probability of $10^{-7}$ will occur every second, but very unlikely that a probability of $10^{-13}$ will occur every second.

The signal spectrum of several types of broadband communication schemes (such as wireless, cellular, WiFi, as CATV) is composed of deep modulation carriers (such as QAM and OFDM). Often, that spectrum is composed of multiple deep modulation carriers. As a result, the RF signal over these media suffers from high PAPR. High PAPR signals exhibit occasional very high instantaneous amplitude peaks which are much higher than the signal average value. Evaluating the nature of a typical CATV signal, a reasonably occurring peak (about once every second) can be ~17 dB. While the probability of such very high peak levels is very low, the probability of lower peak values increases. For example, for the same signal, the probability goes up to $10^{-4}$ for PAPR of about 12 dB.

It is customary to plot PAPR probability of a certain signal in a graph where the X-axis represents $PAPR_{Threshold}$, and the Y-axis represent the probability of any PAPR higher than that $PAPR_{Threshold}$. FIG. 1 is a graph that illustrates a PAPR plot for a typical CATV signal composed of 128×6 MHz channels of 256-QAM modulation in accordance with the known art.

The design of a communication device has to consider the expected PAPR values and their probability by allowing reasonably high instantaneous peaks to be processed with no or minimal distortion by the various components in the signal path. For example, a back off of 16~17 dB is typically used in a DAC (digital to analog converter) processing a broadband CATV signal. In other words, the average (RMS) voltage of the signal is set to be 16~17 dB below the DAC full scale (the maximum signal amplitude that can be handled by the DAC).

FIG. 2 is a time domain linear plot of a typical CATV(t) signal composed of 128×6 MHz channels of 256-QAM modulation in accordance with the known art. FIG. 2 depicts about 600,000 samples of the 768 MHz broad signal sampled at about 2.5 Gsps. Note that the signal has both positive and negative peaks.

FIG. 3 is an absolute linear value plot of the same signal as shown in FIG. 2, namely ABS(CATV(t)), in accordance with the known art. FIG. 4 is a plot of the same signal as shown in FIG. 2 in logarithmic scale, namely 20*log 10(ABS(CATV(t))), scaled with the RMS value at 0 dB, in accordance with the known art.

FIG. 5 is a chart depicting the 100 samples immediately near the highest PAPR recorded in the same signal as shown in FIG. 2 in accordance with the known art. As suggested by FIG. 5, it is typical to find several other peaks not far in value near a very high instantaneous peak.

The term "full duplex," in this context, refers to the ability to simultaneously transmit and receive a signal at the same time, over the same frequency and over a single medium. This is a recent technology development in wireless and broadband communications. Previously, full duplex was used in wireline communications by using two separate media (e.g., 2 separate transmission lines), whereas broadband and wireless communication typically used either TDD (time division duplexing) using the same frequencies for both transmit and receive but not at the same time, or FDD (frequency division duplexing) transmitting and receiving at the same time but at different frequencies. The use of full duplex in broadband and wireless communication tends to increase (as much as double) the available data communication throughput by using the same spectrum for both transmitting and receiving data at the same time.

Conventionally, a signal that is transmitted is referred to as a transmit signal (or Tx signal) and the signal that is received is referred to as the receive signal (or Rx signal). Similarly, the label Tx may be used in conjunction with components involved in the transmission of a signal, and the label Rx may be used in conjunction with components involved in receiving a signal.

FIG. 6 is an illustration of a communication device capable of full duplex in accordance with the known art. In any communication device, the power of a transmitted signal is typically considerably higher than the received signal, since the signal has to go through an attenuating medium before reaching the receiver. In the common path shared by the transmitted and received signals, any reflection causes an echo of the transmit signal to be directed back to the receiver. Such reflection points often exist both inside the communication device itself, as well as in the medium used as the communication link. Often at the receiver multiple instances of these echoes are stronger than the received signal. Thus, using full duplex communication (concurrently transmitting and receiving over the same spectrum) may cause the received signal to be masked by the stronger echo of the transmitted signal. The ability to interpret the received signal through the masking of the multiple echoes of the transmitted signal is enabled by echo cancellation implemented in the communication device.

At the communication device, the transmitted signal is known, as it is generated by the communication device itself prior to transit. Using correlation techniques, the communication device is able to correlate between the transmitted signal and the received signal (which includes echoes of the transmitted signal, the signal intended to be received, and noise from various sources) to estimate the profile of the echoes that the transmitted signal experiences in the common transmit/receive path. Echo profile refers to the exact frequency dependent magnitude, delay, and phase of any individual echo. Once these echoes are estimated, the communication device can convolve the known transmitted signal with the estimated echo profile and subtract the result from the raw signal as received to eliminate the echo of the transmitted signal. The remaining signal is composed of the signal as intended to be received with the addition of noise from various sources including the residual echo signal. Recent developments in communication technology enable the cancellation of transmitted signal echo to a great degree, such that the reception of the intended received signal is practically limited by only the various noise sources in the system, and not the echo itself.

The performance of the simplified echo canceller described above is often limited due to two reasons. First, the transmitted signal is often shaped by the RF circuit after the analog to digital converter (ADC) such that the transmitted signal is not perfectly known by the communication device, which reduces the accuracy of both the correlator/echo estimator and the signal shaping DSP. Second, the actual transmitted signal includes noise and distortions created by various components, but mostly by the power amplifier. The echoes (introduced by the transmission medium) of these noise and distortions are often a severe source of interference impeding proper reception of the intended received signal.

Both these problems can be alleviated by sampling the actual transmitted signal close to the communication device output. FIG. 7 is an illustration of a communication device capable of sampling the actual transmitted signal close to the communication device output in accordance with the prior art. The echo cancellation now implements cancellation of the actual transmitted signal, including the transmitted noise and distortions. Note that the accuracy of the sampled transmission signal is limited by the transmitting (Tx) analog to digital converter (ADC), which can add noise and distortions to the sampled signal. The noise and distortions added by the Tx ADC is typically much smaller than those on the transmitted signal, so overall an improvement of performance is experienced.

Both the Tx ADC and the receiving (Rx) ADC have a limited dynamic range, which introduces noise and distortions to the sampled signal. Such noise and distortions to the sampled signal are described through various parameters, such as ACLR (adjacent channel leakage ratio), SFDR (spurious free dynamic range), and ENOB (effective number of bits). While the largest possible dynamic range is desirable to reduce noise and distortions, the dynamic range is often limited by power consumption, cost, the available technology, and other constraints.

In the Tx ADC, variable attenuation may be applied to the sampled signal to optimize the level of that signal considering its PAPR to place it optimally relative to the Tx ADC dynamic range. Similarly, the received signal level can be adjusted prior to the Rx ADC. Note that due to the echoes of the transmitted signal being considerably higher than the intended received signal, some of the Rx ADC dynamic range is "wasted" on these echoes to prevent them from saturating the Rx ADC and distorting the received signal. In fact, the available Rx ADC dynamic range is effectively reduced by the ratio between the peak amplitude levels of the total received signal and the peak amplitude levels of the intended received signal. Accordingly, a higher Rx ADC dynamic range is required in a full duplex system relative to that required in a non-full-duplex system.

An optional scheme that may be used in full duplex communication device to reduce the peak amplitudes of the analog/RF signal to be converted to digital is pre-cancellation DAC for dynamic range improvement. Instead of subtracting the estimated signal in the digital domain after the Rx ADC, a digital estimated signal can be converted to analog by a DAC, and subtracted from the received signal in the analog/RF domain. The residual analog signal after this subtraction (including the intended received signal) can then be adjusted by applying additional gain to be closer to the full scale of the Rx ADC, resulting in a higher ratio between the intended received signal and the Rx ADC noise level. The drawback is that another non-cancellable noise source is added to the received signal, namely the pre-cancellation DAC noise. Accordingly, this technique is advantageous when the pre-cancellation DAC dynamic range is higher than the Rx ADC dynamic range. Typically, for a given semiconductor technology, the DAC dynamic range is indeed a few dB higher than ADC dynamic range. Additional drawbacks of using pre-cancellation DAC are that it requires additional hardware (i.e., silicon) in the communication device, and thus, increases the cost. Another drawback is that since the pre-cancellation DAC requires power to operate, using a pre-cancellation DAC increases the overall power consumption of the communication device.

However, there are cases where the available DAC dynamic range is not better than the available ADC dynamic range. When this is the case, the usage of a pre-cancellation DAC will worsen performance, and it should be avoided. Similarly, it is conceivable that the performance gain of using a pre-cancellation DAC can sometimes be too small to justify the additional cost associated with more hardware or the additional power consumption associated with that DAC.

Pre-cancellation DAC can be used to improve the dynamic range of both the Rx ADC used for converting the received signal (where it can improve the ratio between the intended receive signal and the non-cancellable Rx ADC noise level), as well as the Tx ADC used for transmitted signal sampling (where it improves the ratio between the sampled transmitted signal and its noise relative to the non-cancellable sampling Tx ADC noise).

FIG. 8 is an illustration of a communication device having a transmit pre-cancellation DAC (Tx P-C DAC) in accordance with the prior art. FIG. 8 illustrates how the transmit pre-cancellation DAC (Tx P-C DAC) is used to reduce the peak amplitude into the Tx ADC, and improve the overall transmitted signal sampling dynamic range. Note that subtracting the estimated transmitted signal in analog domain before the Tx ADC has to be reversed (by adding it back digitally) before the sampled signal is used in the rest of the system. FIG. 8 also illustrates how the Rx P-C DAC is used to reduce the peak amplitude into the Rx ADC, and improve the overall received signal sampling dynamic range. In this case, the subtracted signal is added back digitally for the benefit of the correlator and echo profile estimator, but the receiver can process the Rx ADC direct output which now has the estimated echo subtracted from the received signal.

BRIEF DESCRIPTION OF THE DRAWINGS

Embodiments of the invention are illustrated by way of example, and not by way of limitation, in the figures of the accompanying drawings and in which like reference numerals refer to similar elements and in which.

DETAILED DESCRIPTION OF THE INVENTION

Approaches for increasing an analog to digital converter (ADC) dynamic range for a communication device are presented herein. In the following description, for the purposes of explanation, numerous specific details are set forth in order to provide a thorough understanding of the embodiments of the invention described herein. It will be apparent, however, that the embodiments of the invention described herein may be practiced without these specific details. In other instances, well-known structures and devices are shown in block diagram form or discussed at a high level in order to avoid unnecessarily obscuring teachings of embodiments of the invention.

The existing state of the art employs a pre-cancellation (PC) digital to analog converter (DAC) to generate a continuous signal. Embodiments of the invention, rather than employing the pre-cancellation DAC to generate a continuous signal, make use of an additional element (termed herein a "Peak Amplitude Separation") leading to the pre-cancellation DAC. The Peak Amplitude Separation element evaluates the instantaneous amplitude of the signal to be applied to the pre-cancellation DAC, and compares that instantaneous signal to a reference threshold. For each pre-cancellation DAC sample, if the instantaneous signal is smaller (in absolute value) than the threshold, the pre-cancellation DAC receives a "zero" signal. However, if the instantaneous signal is larger (in absolute value) than the threshold, then the pre-cancellation DAC receives the instantaneous signal sample.

When the pre-cancellation DAC signal is subtracted (in analog/RF) from the received signal, only the received signal peaks having an absolute value higher than the threshold are affected. Accordingly, the PAPR of the received signal is reduced by the ratio between the pre-cancellation DAC full scale and the reference threshold. This ratio is referred to herein as the "PAPR improvement factor." This enables raising the power of the received signal by the PAPR improvement factor, and accordingly, improves the ratio between the intended received signal and the ADC noise level by the PAPR improvement factor.

Figure 1:
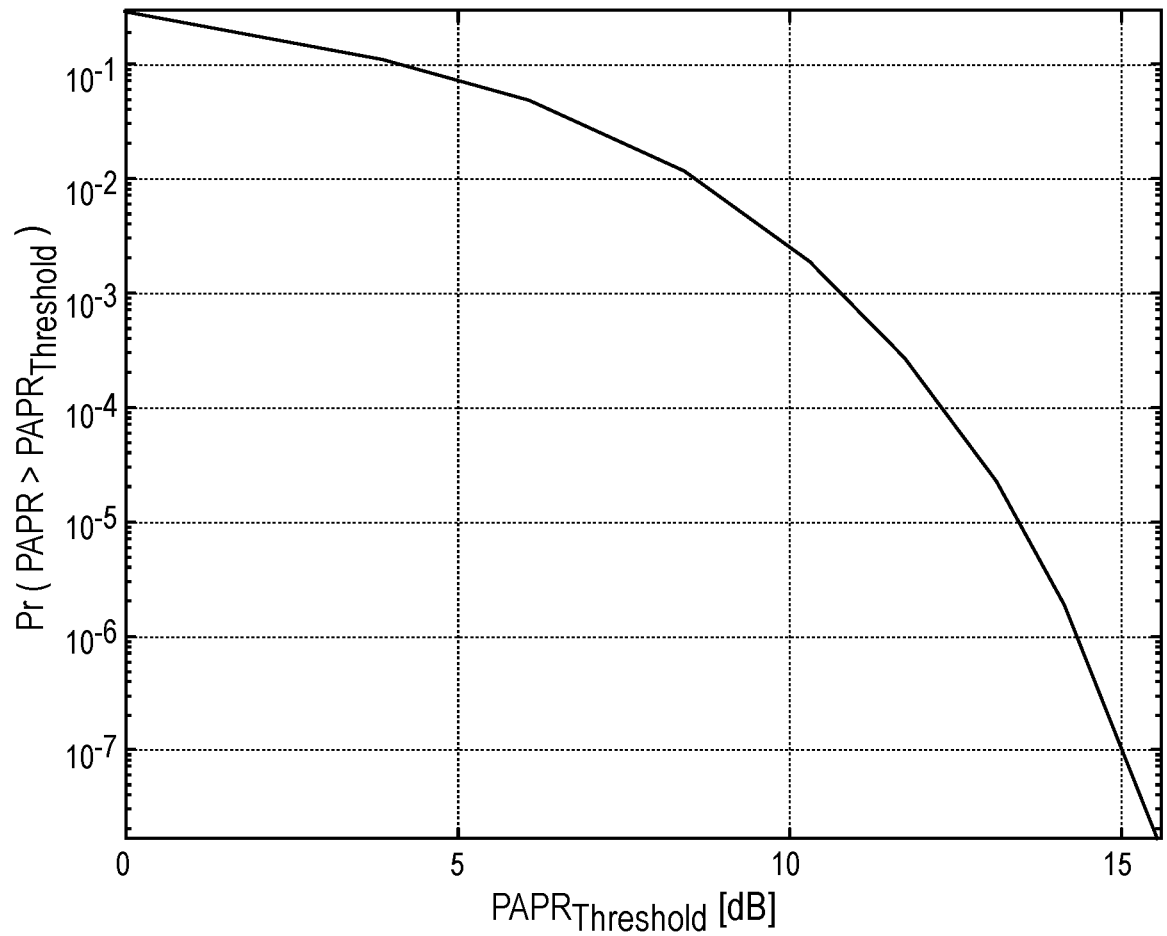
FIG. 1 is a graph that illustrates a PAPR plot for a typical CATV signal composed of 128×6 MHz channels of 256-QAM modulation in accordance with the known art.
Figure 2:
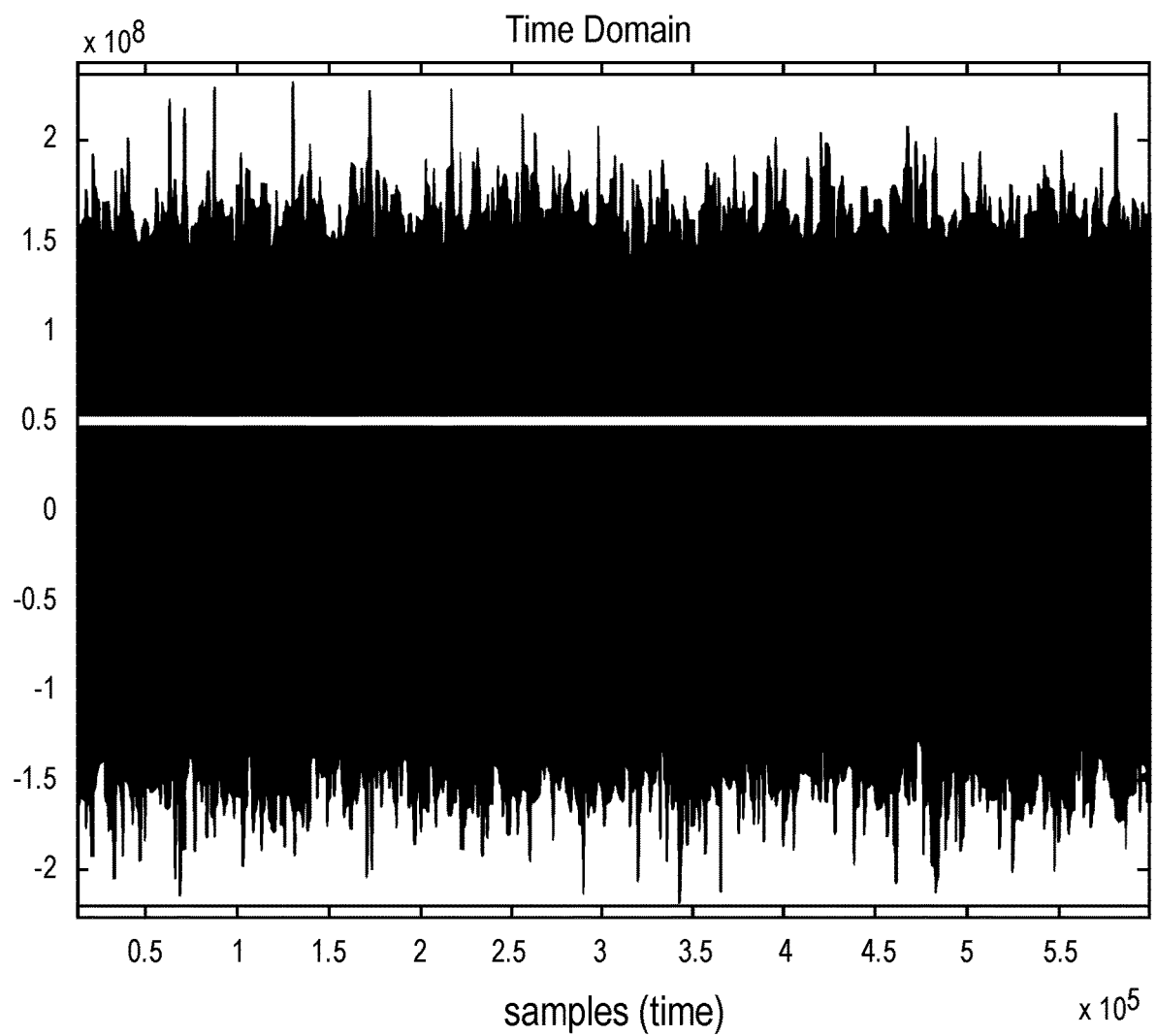
FIG. 2 is a time domain linear plot of a typical CATV(t) signal composed of 128×6 MHz channels of 256-QAM modulation in accordance with the known art.
Figure 3:
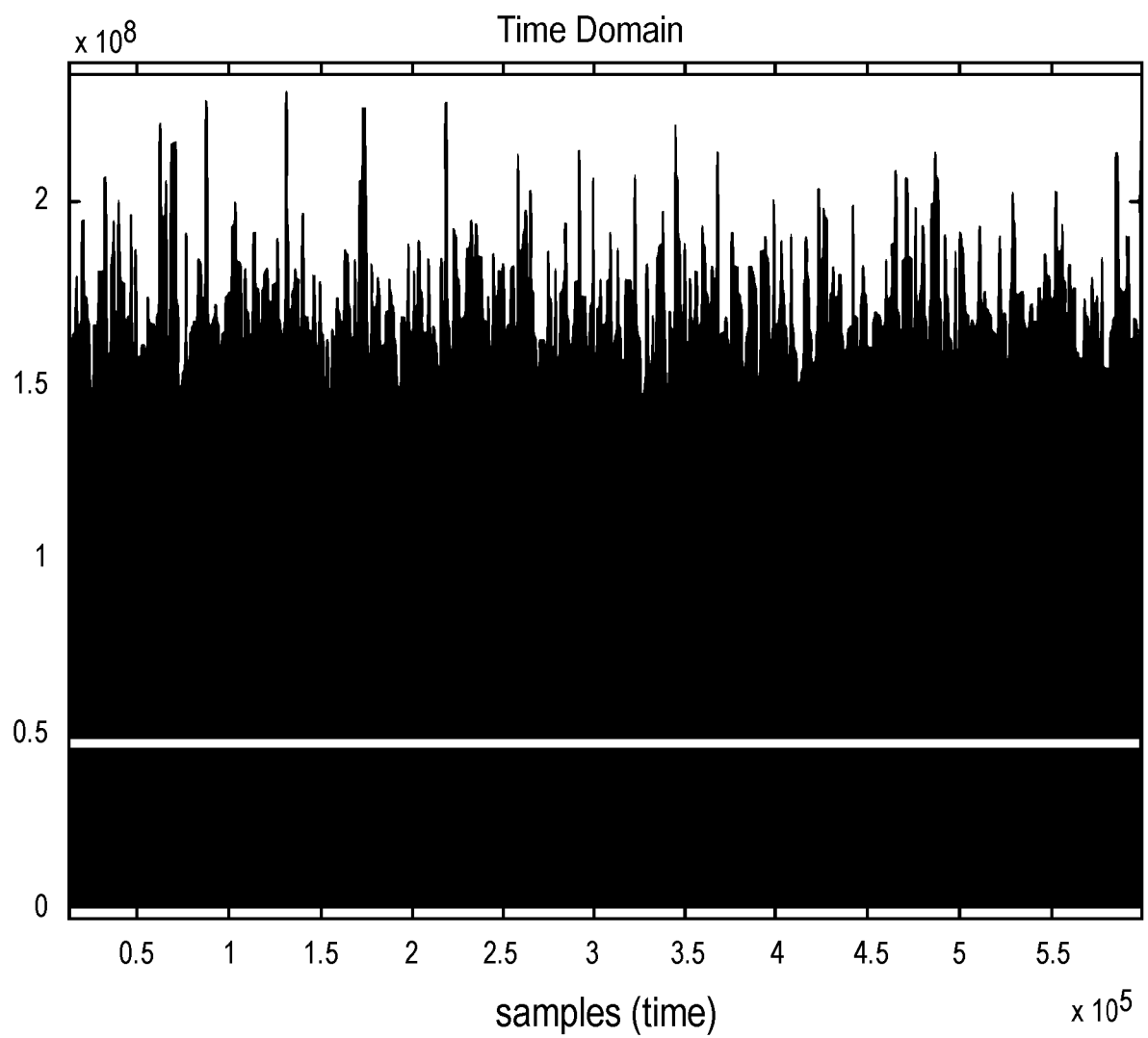
FIG. 3 is an absolute linear value plot of the same signal as shown in FIG. 2, namely ABS(CATV(t)), in accordance with the known art.
Figure 4:
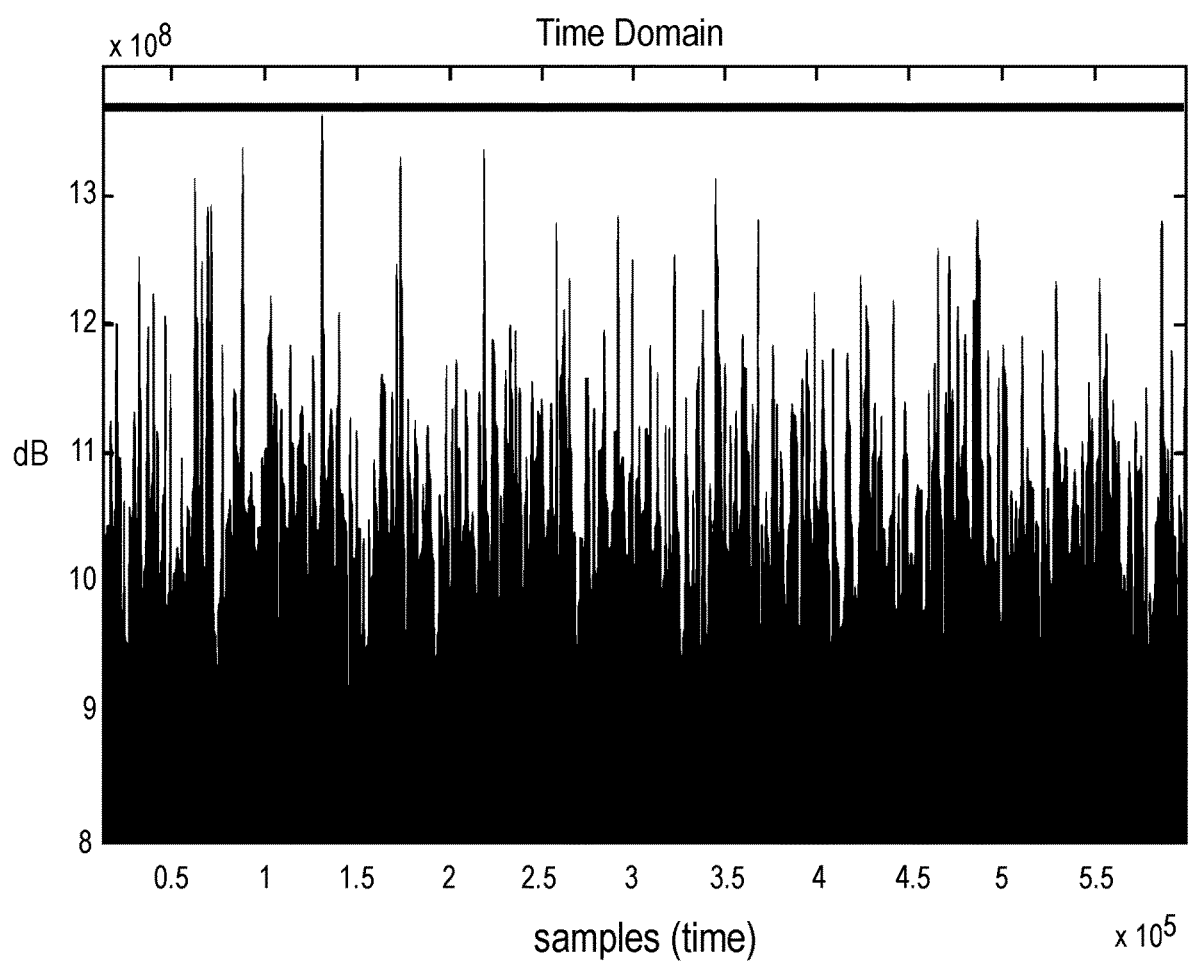
FIG. 4 is a plot of the same signal as shown in FIG. 2 in logarithmic scale, namely 20*log 10(ABS(CATV(t))), scaled with the RMS value at 0 dB, in accordance with the known art.
Figure 5:
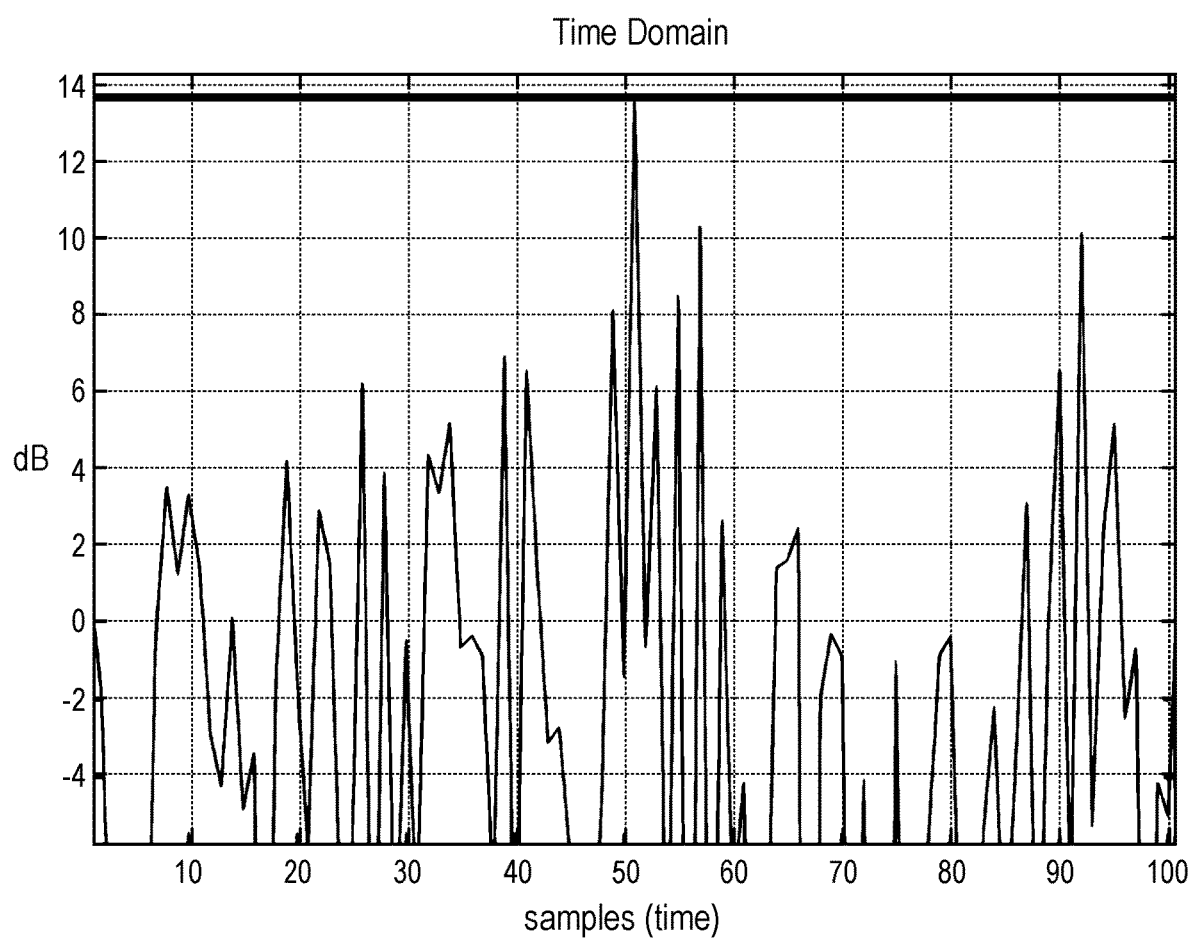
FIG. 5 is a chart depicting the 100 samples immediately near the highest PAPR recorded in the same signal as shown in FIG. 2 in accordance with the known art.
Figure 6:
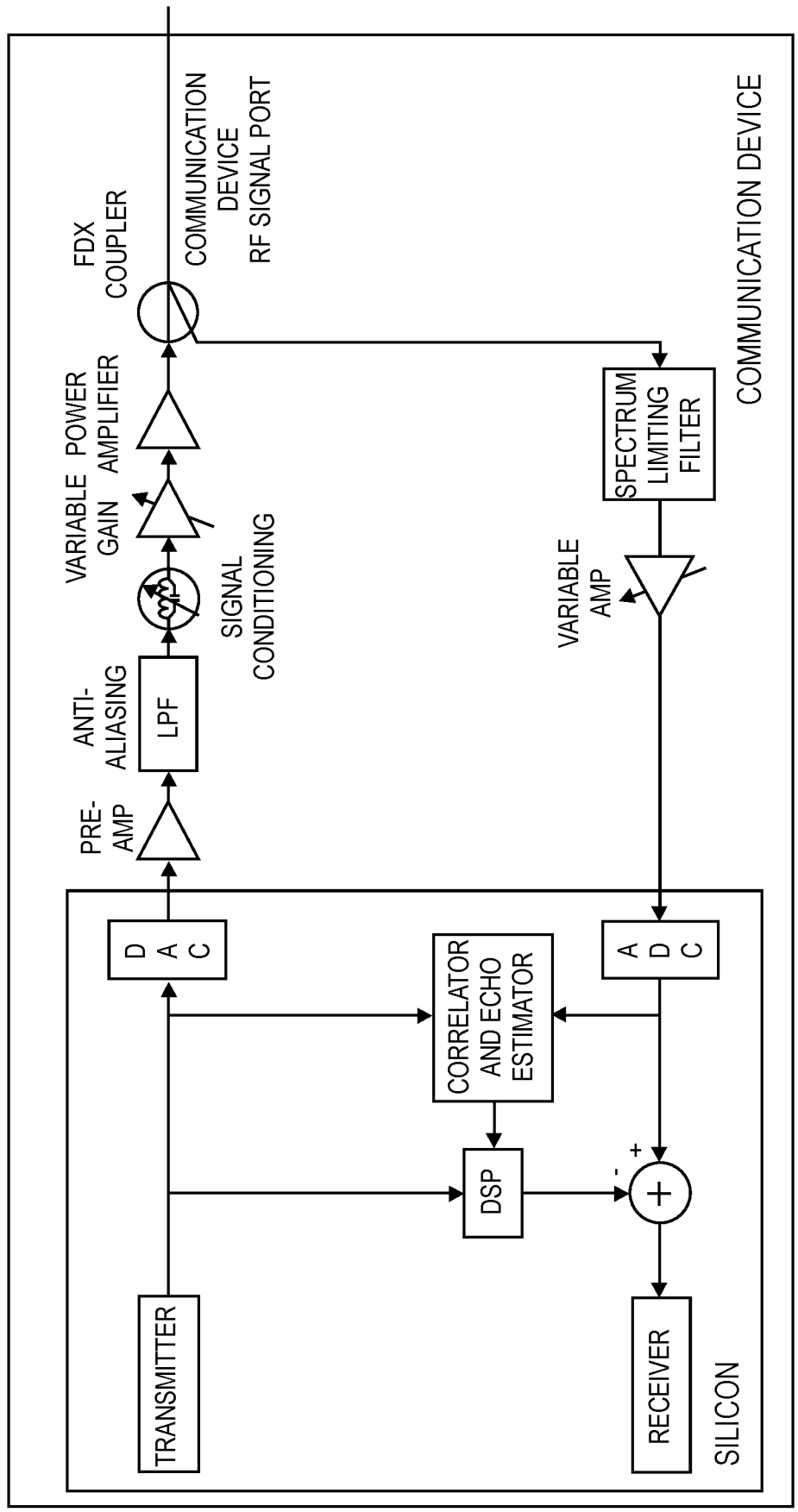
FIG. 6 is an illustration of a communication device capable of full duplex in accordance with the known art.
Figure 7:
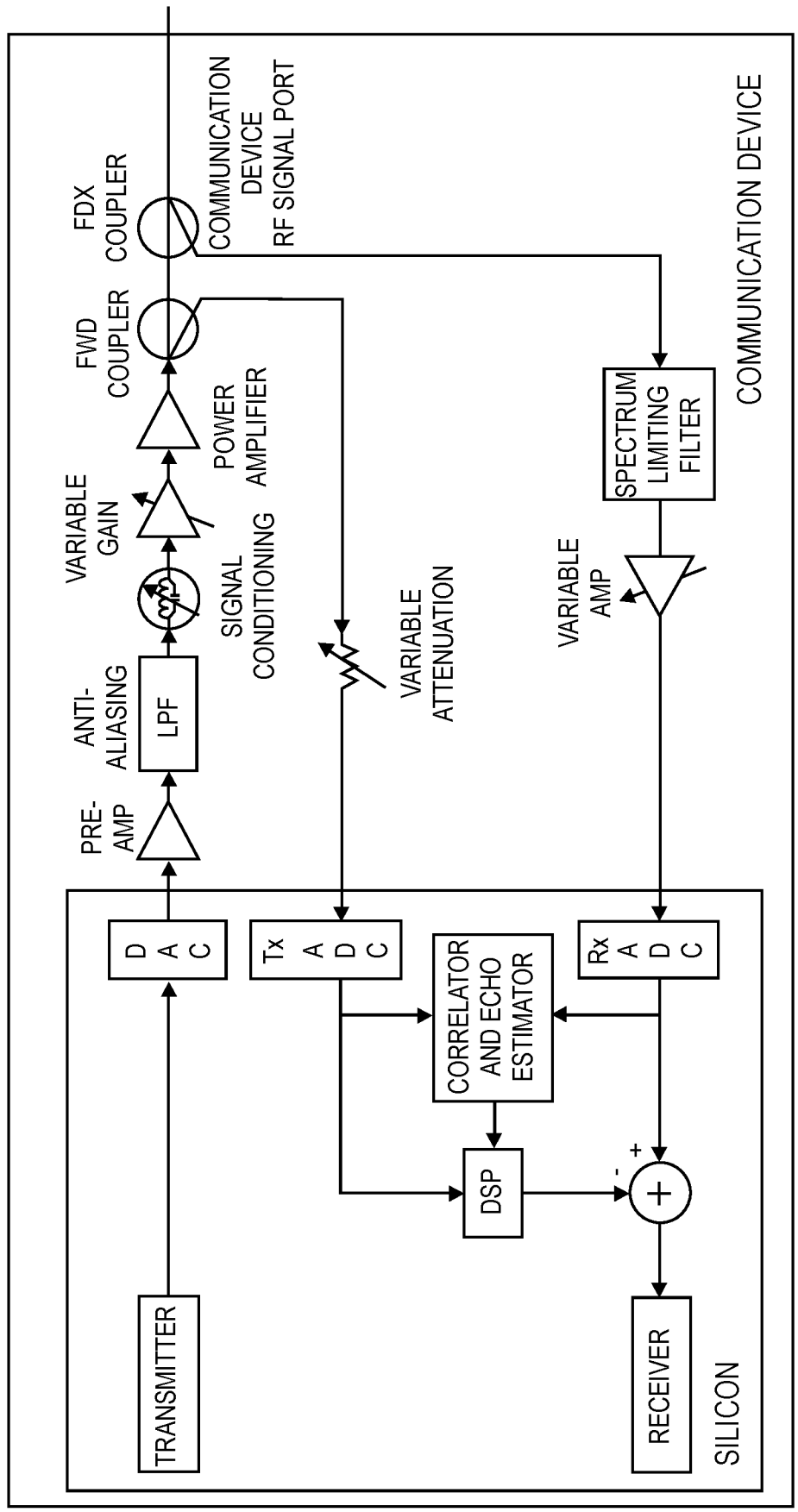
FIG. 7 is an illustration of a communication device capable of sampling the actual transmitted signal close to the communication device output in accordance with the prior art.
Figure 8:
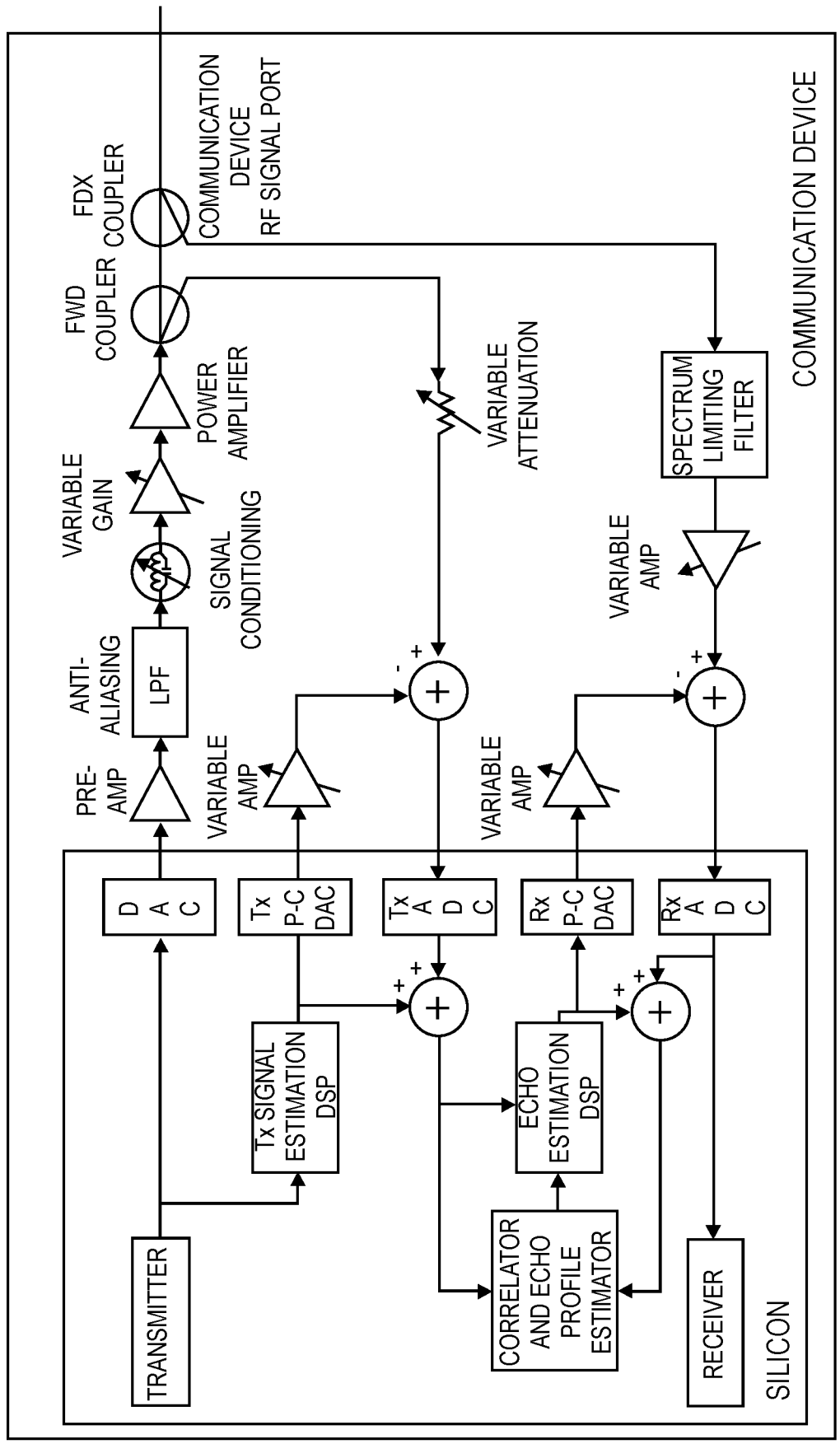
FIG. 8 is an illustration of a communication device having a transmit pre-cancellation DAC (Tx P-C DAC) in accordance with the prior art.
Figure 9:
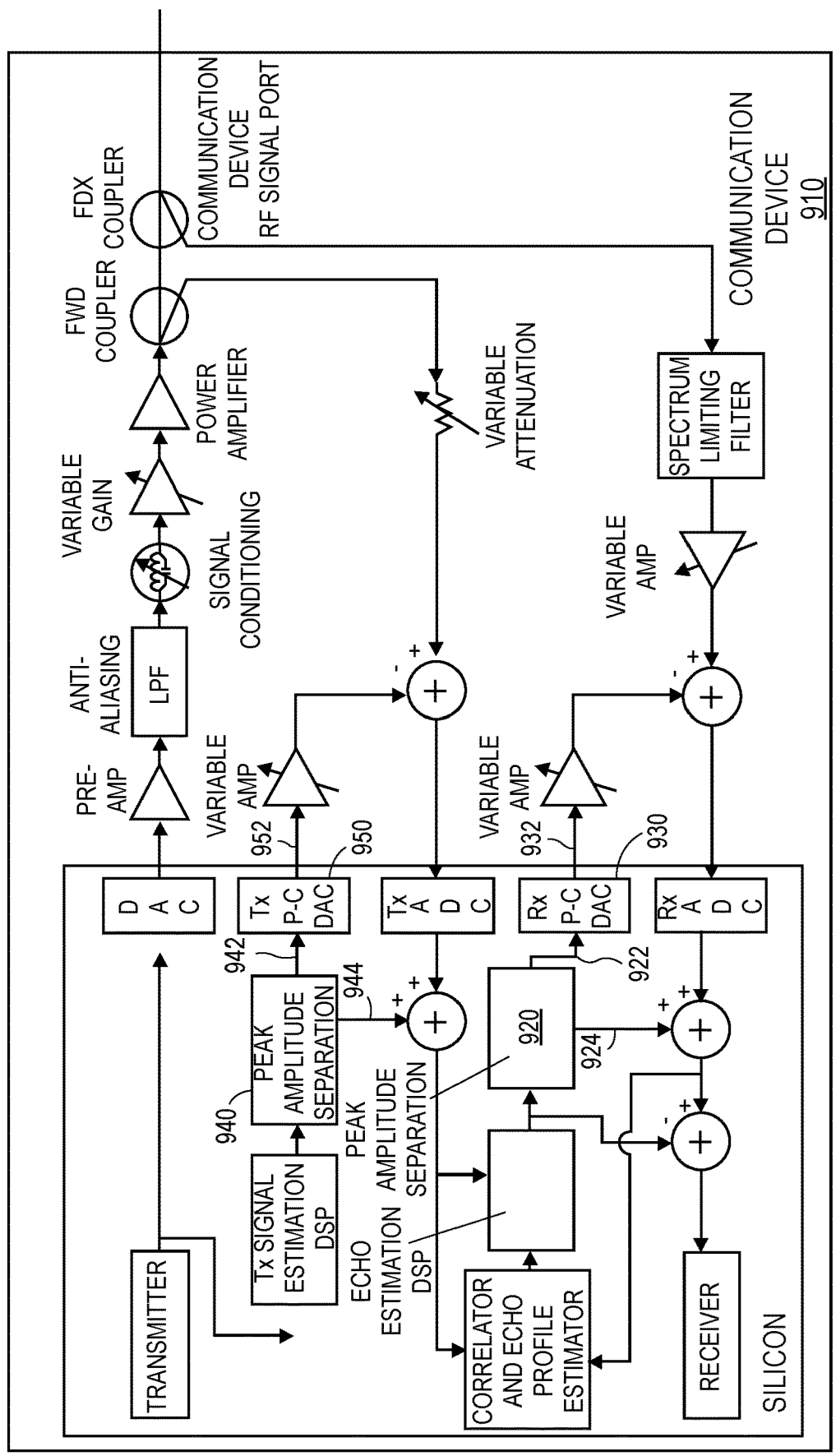
FIG. 9 is an illustration of a communication device that incorporates a peak amplitude separation elements both before the Tx pre-cancellation DAC and before the Rx pre-cancellation DAC in accordance with an embodiment of the invention.

FIG. 9 is an illustration of a communication device 910 that incorporates a peak amplitude separation element 920 before the Rx pre-cancellation DAC 930 in accordance with an embodiment of the invention. As shown in FIG. 9, communication device 910 also incorporates a peak amplitude separation element 940 before the Tx pre-cancellation DAC 950 in accordance with an embodiment of the invention Embodiments of the invention use two different outputs of a peak amplitude separation element. To illustrate, peak amplitude separation element 920 comprises first output 922 and second output 924. First output 922 directly drives the pre cancellation DAC 930, and second output 924 may be adjusted to account for inaccuracies of the pre cancellation DAC 930, and as a replacement and/or fine tuning of analog gain alignment of the pre cancellation DAC output signal 932.

As another illustration, peak amplitude separation element 940 comprises first output 942 and second output 944. First output 942 directly drives the pre cancellation DAC 950, and second output 944 may be adjusted to account for inaccuracies of the pre cancellation DAC 950, and as a replacement and/or fine tuning of analog gain alignment of the pre cancellation DAC output signal 952.

Figure 10:
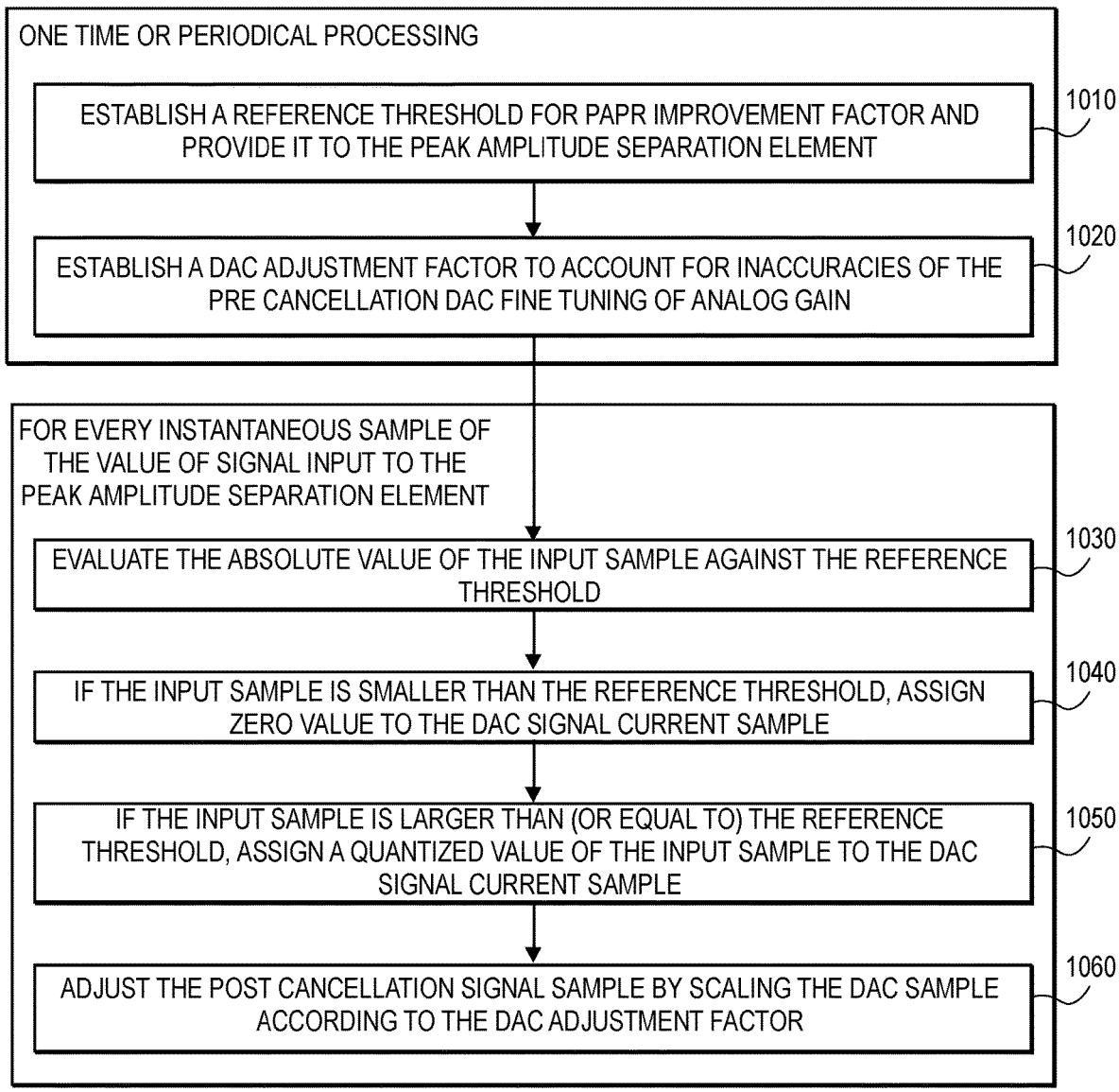
FIG. 10 is a flowchart depicting the functional steps of increasing an analog to digital converter (ADC) dynamic range for a communication device according to an embodiment of the invention.

FIG. 10 is a flowchart depicting the functional steps of increasing an analog to digital converter (ADC) dynamic range for a communication device according to an embodiment of the invention. The steps of FIG. 10 shall be explained below with reference to communication device 910 shown in FIG. 9.

Steps 1010 and 1020 in FIG. 10 are performed but once or performed periodically. In step 1010 of an embodiment, a reference threshold for the PAPR improvement factor for a particular peak amplitude separation element is established, such as peak amplitude separation element 920 or 940, and subsequently provided to that particular peak amplitude separation element. In a certain embodiment of the invention, the reference threshold can be predetermined (for example, established in communication device 910 at the time of its manufacturing or provided to communication devices 910 by means of a one-time or occasional external configuration). In a different embodiment of the invention, the reference threshold can be calculated, either periodically or as needed, by an algorithm designed to optimize certain operational parameters (such as maximizing the efficiency of the echo canceller in communication device 910).

In step 1020, a DAC adjustment factor is established. The DAC adjustment factor is used to configure the behavior of a peak amplitude separation element to account for inaccuracies of the pre-cancellation DAC fine tuning of analog gain. Thus, in performing step 1020, a DAC adjustment factor is established for each of peak amplitude separation elements 920 and 940. In an embodiment, the DAC adjustment factor established for peak amplitude separation element 920 may be, but need not be, different than the DAC adjustment factor established for peak amplitude separation element 940.

For every instantaneous sample of the value of signal input a peak amplitude separation element performs each of steps 1030-1060 depicted in FIG. 10. In step 1030, a peak amplitude separation element evaluates the instantaneous amplitude of the signal to be applied to the pre-cancellation DAC, and compares that instantaneous signal to a reference threshold established for that peak amplitude separation element. To illustrate a concrete example, peak amplitude separation element 920 may perform step 1030 by evaluating the instantaneous amplitude of the signal to be applied to pre-cancellation DAC 930 and compare that instantaneous signal to the reference threshold established for peak amplitude separation element 920. As another concrete example, peak amplitude separation element 940 may perform step 1030 by evaluating the instantaneous amplitude of the signal to be applied to pre-cancellation DAC 950 and compare that instantaneous signal to the reference threshold established for peak amplitude separation element 940.

In step 1040, for each pre-cancellation DAC sample, if it was determined in step 1030 that the instantaneous signal is smaller (in absolute value) than the reference threshold, then pre-cancellation DAC receives a "zero" signal. To illustrate a concrete example involving peak amplitude separation element 920, in step 1040, for each pre-cancellation DAC sample, if it was determined in step 1030 that the instantaneous signal is smaller (in absolute value) than the reference threshold established for peak amplitude separation element 920, then pre-cancellation DAC 930 receives a "zero" signal over first output 922. As another concrete example involving peak amplitude separation element 940, in step 1040, for each pre-cancellation DAC sample, if it was determined in step 1030 that the instantaneous signal is smaller (in absolute value) than the reference threshold established for peak amplitude separation element 940, then pre-cancellation DAC 950 receives a "zero" signal over first output 942.

On the other hand, in step 1050, if it was determined in step 1030 that the instantaneous signal is larger (in absolute value) than the reference threshold, then the pre-cancellation DAC receives the instantaneous signal sample. For example, if it was determined in step 1030 by peak amplitude separation element 920 that the instantaneous signal is larger (in absolute value) than the reference threshold, then in step 1050, pre-cancellation DAC 930 receives the instantaneous signal sample. As another example, if it was determined in step 1030 by peak amplitude separation element 940 that the instantaneous signal is larger (in absolute value) than the reference threshold, then in step 1050, pre-cancellation DAC 950 receives the instantaneous signal sample.

In step 1060, the post cancellation signal sample is adjusted by scaling the DAC sample according to the DAC adjustment factor. An advantage of this approach is that the noise generated by the pre-cancellation DAC while it processes a "zero" signal is negligible—practically zero noise. The pre-cancellation DAC does add non-cancellable noise when instantaneous samples larger than the reference threshold are converted to analog by it. However, the probability of these samples is very low. At the receiver, these very rare noise events are averaged over time with the much more common zero noise from the pre-cancellation DAC to produce a very low effective noise level, which can be much lower than the other noises in the system, especially the ADC noise, and thus practically negligible.

In setting the reference threshold in step 1010, a tradeoff exists between how much improvement to the ADC dynamic range is achieved (lower threshold enables higher improvement dB per dB), and how rare are the instantaneous samples which their amplitude is greater than that reference threshold. A lower reference threshold makes the non-zero samples more common. Due to the steep nature of the PAPR curve, a dB lower reference threshold may increase the probability of non-zero samples by one or two orders of magnitude. A typical compromise may enable a 6 dB difference between the pre-cancellation DAC full scale and the reference threshold, enabling 6 dB improvement in ADC dynamic range, while generating additional instantaneous noise at the probability of about $10^{-4}$ and at an average over time level of 20 dB or better than the rest of the noise in the system. Thus, in practical effect the pre-cancellation DAC noise on the signal reception is negligible.

Embodiments may improve the dynamic range of both the Rx ADC 930 used for converting the received signal (where it can improve the ratio between the intended receive signal and the non-cancellable ADC noise level), as well as the Tx ADC 950 used for transmitted signal sampling (where it improves the ratio between the sampled transmitted signal and its noise relative to the non-cancellable sampling ADC noise).

An intended use of an embodiment is to reduce the high peak instantaneous signal amplitudes below the reference threshold. There is no real advantage in complete cancellation of these high peak instantaneous signal samples to achieve zero level. It can be advantageous to simplify the pre-cancellation DAC such that it can reduce the required amplitude by a rough but known quantized amount. In principle, a 1-bit DAC, properly adjusted and calibrated, may be sufficient for a case where the reference voltage is up to 6 dB lower than the highest PAPR peak. In practical terms, a 2 or 3 bit DAC may be sufficient for any required cancellation level.

Figure 13:
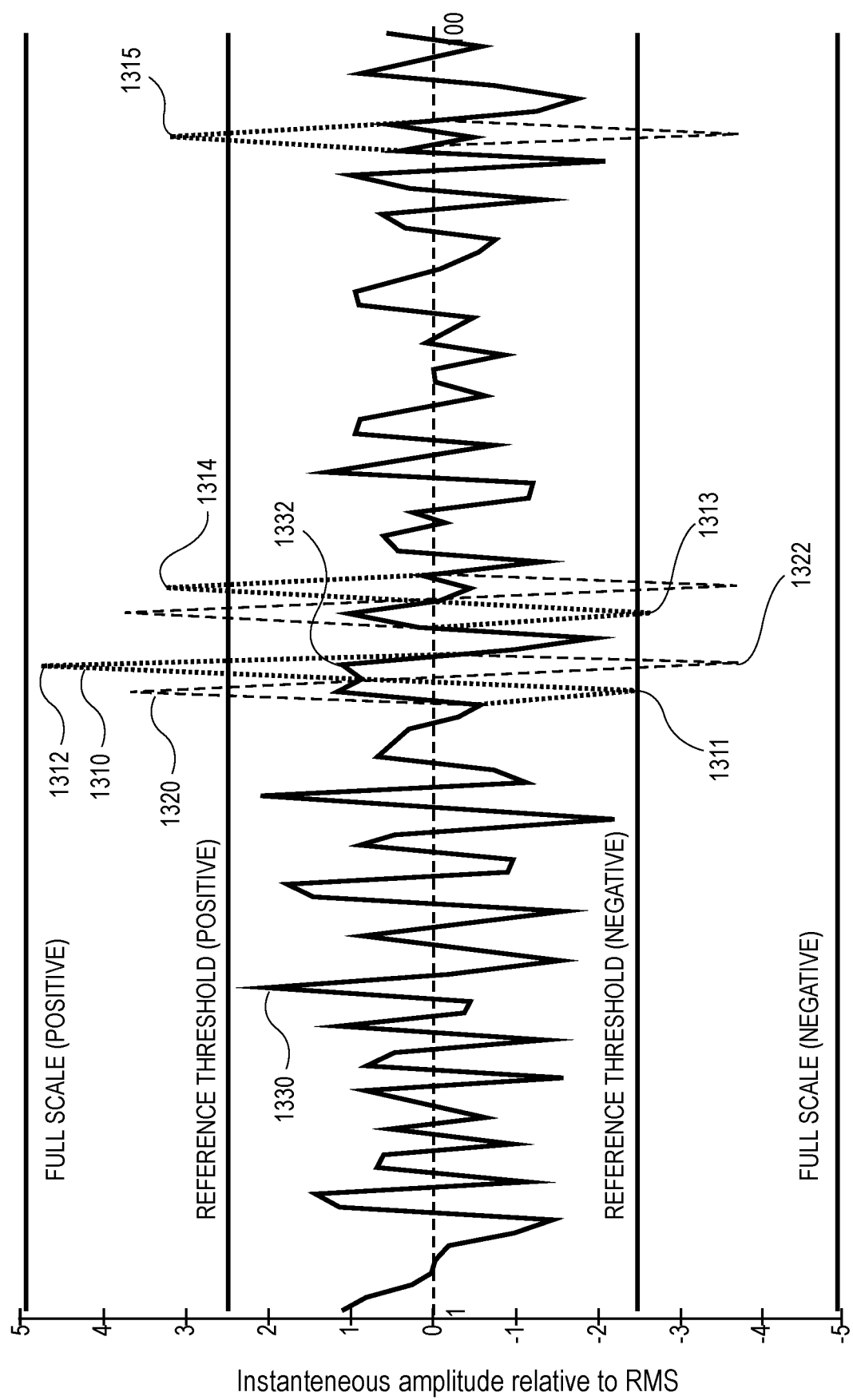
FIG. 13 is an illustration depicting the cancellation of large PAPR peaks achieved by an embodiment of the invention.

FIG. 13 is an illustration of an overlay of 3 sampled signals around a large PAPR peak plotted in a log scale in accordance with an embodiment of the invention. The 3 sampled signals are (a) the original virtual (if analog/RF cancellation is not implemented) samples of a large PAPR signal 1310, (b) the output of a peak amplitude separation element leading to a 2-bit P-C DAC 1320, and (c) the actual signal sampled by the ADC after analog/RF cancellation

1330. As can be observed, a 2-bit pre-cancellation DAC is sufficient to lower large PAPR peaks to below the reference threshold, enabling readjustment of the received signal by applying additional gain prior to the ADC, thus improving the signal-to-noise ratio of the received signal sampling.

Embodiments of the invention enable the use of a very simple, low cost, and low power DAC to obtain great ADC DR improvement. Such an improvement can be achieved even when the available DAC technology has a lower dynamic range than the available ADC technology.

Modern high sample rate DAC implementations often use a current steering scheme. In such a scheme, a multitude of switched current elements are used, where each element is typically composed of a constant current source, a current diversion switch, and a current sink. Each current diversion switch is controlled by a logical signal that is obtained from the sample processed by the DAC to divert the current source to either the DAC output or to the current sink. Some implementations use the current diversion switch to divert the current between two separate and complementary outputs of the DAC. This scheme has greater accuracy relative to a scheme in which the current sources are directly turned on or off by the logical signal. This is so because current diversion can be much faster than turning the current on or off and because current diversion is much less prone to a memory effect where the current applied to the output load at one sample is affected by the current applied to the load during previous samples. Since the current sources of a current diversion DAC are always on, its power consumption is relatively constant.

Figure 11:
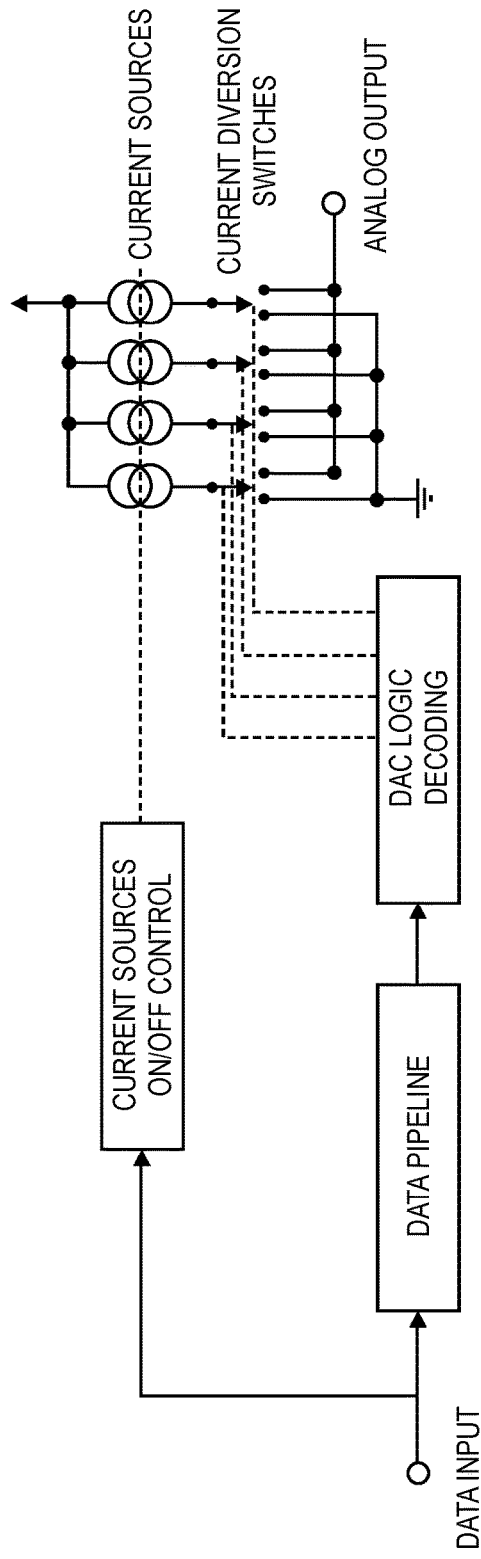
FIG. 11 is an illustration of an on/off pre-cancellation DAC with four current sources in accordance with an embodiment of the invention.

As explained above, the shallow (i.e., very few bits) DAC used in an embodiment is provided a zero value during most of the samples, and is required to provide non-zero value in low probability circumstances. To provide further power consumption saving, an embodiment that utilizes an on/off DAC can be used. In such an embodiment, the current sources in the DAC are normally turned off while a zero value is provided to the DAC. Several samples before a non-zero sample is provided, the current sources are turned on, while the current diversion switches direct the current to the sink. When the actual non-zero sample arrives at the DAC, the current sources had sufficient time to turn on and stabilize to their desired current level, and the current diversion switches direct the desired current sources to the output load. After the DAC input goes back to zero, the current diversion switches direct the current back to the sink, and the current sources are turned off again. The on/off DAC operation requires a small delay pipeline of several samples to allow it to observe the "future" data samples so it can start turning the current sources on in advance. FIG. 11 illustrates an on/off pre-cancellation DAC with four current sources in accordance with an embodiment of the invention. This approach allows saving in power consumption since the current sources, which require most of the DAC consumed power, can be off most of the time. For example, if the current sources are turned on 8 samples before a non-zero sample and a single sample after a non-zero sample, and for a signal with a non-zero probability of 10^3, the current sources are on only 1% of the time.

Figure 12:
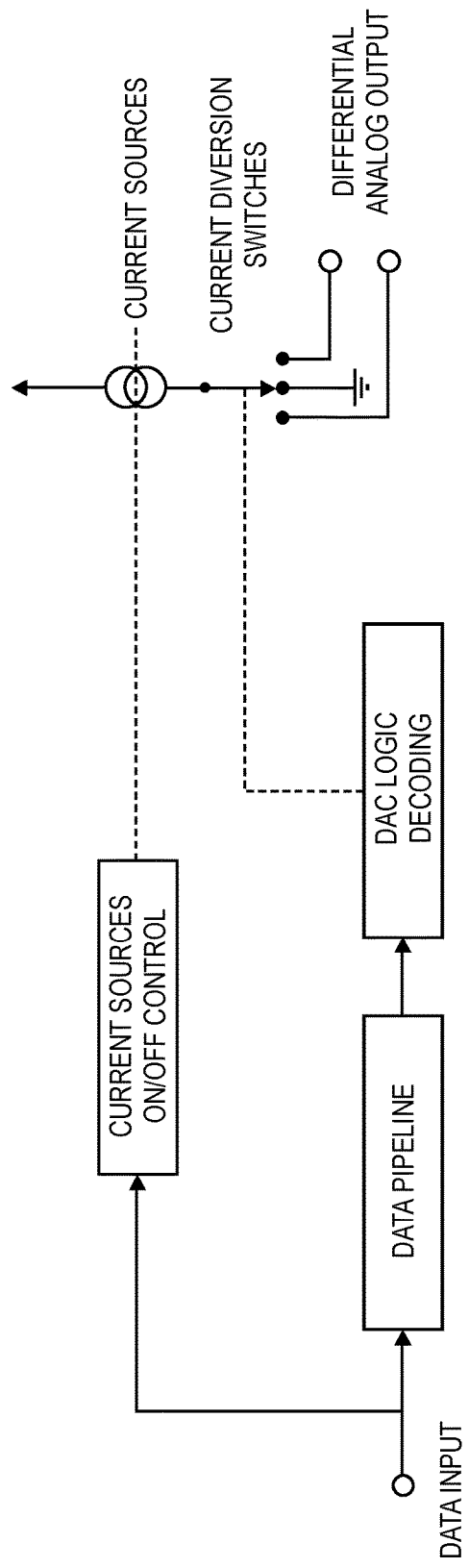
FIG. 12 illustrates an on/off three-state pre-cancellation DAC with only a single current source in accordance with an embodiment of the invention.

Another possible optimization of a pre-cancellation DAC is optimized for the use of differential output signals. The current of each of the current sources of the DAC can be diverted by the current diversion switch to the positive output, the negative output, or the current sink. Thus the possible outputs are I, −I or 0 respectively (where I is the current of the current source). Such an implementation is especially suited to efficient cancellation of larger PAPR peaks. FIG. 12 illustrates an on/off three-state pre-cancellation DAC with only a single current source in accordance with an embodiment of the invention.

In such an implementation as shown in FIG. 12, the DAC output can be scaled such that the current source amplitude is adjusted to about 75% of the full scale amplitude of the estimated received signal.

FIG. 13 is an illustration depicting the cancellation of large PAPR peaks achieved by an embodiment of the invention. The reference threshold is set to 50% (6 dB) of the full scale of the received signal. Of the 100 samples depicted in FIG. 13, there are five large PAPR peaks in the FIG. 13 (3 peaks are positive and 2 peaks are negative) which are larger in amplitude than the reference threshold. The three positive peaks which are larger in amplitude than the reference threshold are peaks 1312, 1314, and 1315, and the two negative peaks which are larger in amplitude than the reference threshold are peaks 1311 and 1313. Both the original large PAPR peaks and the signal after those peaks are reduced are depicted in FIG. 13. Note that the large PAPR peaks are not reduced to zero, but their amplitude is below the reference threshold after the reduction.

For example, the amplitude of the positive peak 1312 of the received signal may be reduced by adding a negative DAC output sample 1322 with a value equivalent to 50% of the full scale of the received signal. The resulting signal has its peak 1332 diminished to a level smaller than the original signal's 50% full scale. Similarly, the amplitude of the negative peaks (peaks 1311 and 1313) of the received signal may be reduced by adding a positive DAC output sample with a value equivalent to 50% of the full scale of the received signal. This 50% full scale can be adjusted by configuring the current value "I" of the single current source or by adjusting the gain of an external amplifier prior to subtracting the pre cancellation DAC output from the received signal. This adjustment can be made on a onetime basis, a periodical basis, or on a continuous basis.

In the foregoing specification, embodiments of the invention have been described with reference to numerous specific details that may vary from implementation to implementation. Thus, the sole and exclusive indicator of what is the invention, and is intended by the applicants to be the invention, is the set of claims that issue from this application, in the specific form in which such claims issue, including any subsequent correction. Any definitions expressly set forth herein for terms contained in such claims shall govern the meaning of such terms as used in the claims. Hence, no limitation, element, property, feature, advantage or attribute that is not expressly recited in a claim should limit the scope of such claim in any way. The specification and drawings are, accordingly, to be regarded in an illustrative rather than a restrictive sense.

What is claimed is:

1. One or more non-transitory computer-readable storage mediums storing one or more sequences of instructions for increasing an analog to digital converter (ADC) dynamic range for a communications device, which when executed by one or more processors, cause:

in the communications device, establishing a reference threshold for a peak to average power ratio (PAPR) improvement factor for RF signals received by the communications device;

a peak amplitude separation element evaluating an absolute value of a portion of a particular RF signal against said reference threshold;

upon the peak amplitude separation element determining that the portion is smaller than said reference threshold, the peak amplitude separation element assigning a zero value to a DAC signal current sample; and upon the peak amplitude separation element determining that the portion is larger or equal to said reference threshold, the peak amplitude separation element assigning a quantized value of the sample to the DAC signal current sample.

2. The one or more non-transitory computer-readable storage mediums of claim 1, wherein the communications device is deployed in a Cable Television (CATV) system.

3. The one or more non-transitory computer-readable storage mediums of claim 1, wherein the communications device performs full duplex (FDX) Data Over Cable Service Interface Specifications (DOCSIS) operations.

4. The one or more non-transitory computer-readable storage mediums of claim 1, wherein the communications device is a point-to-point wireless link.

5. The one or more non-transitory computer-readable storage mediums of claim 1, wherein the communications device is a cellular backhaul.

6. The one or more non-transitory computer-readable storage mediums of claim 1, wherein the communications device is a Wi-Fi repeater.

7. An apparatus for increasing an analog to digital converter (ADC) dynamic range for a communications device, comprising:
one or more processors; and
one or more non-transitory computer-readable storage mediums storing one or more sequences of instructions, which when executed, cause:
in the communications device, establishing a reference threshold for a peak to average power ratio (PAPR) improvement factor for RF signals received by the communications device;
a peak amplitude separation element evaluating an absolute value of a portion of a particular RF signal against said reference threshold;
upon the peak amplitude separation element determining that the portion is smaller than said reference threshold, the peak amplitude separation element assigning a zero value to a DAC signal current sample; and
upon the peak amplitude separation element determining that the portion is larger or equal to said reference threshold, the peak amplitude separation element assigning a quantized value of the sample to the DAC signal current sample.

8. The apparatus of claim 7, wherein the communications device is deployed in a Cable Television (CATV) system.

9. The one or more non-transitory computer-readable storage mediums of claim 7, wherein the communications device performs full duplex (FDX) Data Over Cable Service Interface Specifications (DOCSIS) operations.

10. The one or more non-transitory computer-readable storage mediums of claim 7, wherein the communications device is a point-to-point wireless link.

11. The one or more non-transitory computer-readable storage mediums of claim 7, wherein the communications device is a cellular backhaul.

12. The one or more non-transitory computer-readable storage mediums of claim 7, wherein the communications device is a Wi-Fi repeater.

13. The one or more non-transitory computer-readable storage mediums of claim 7, wherein the apparatus is coupled to said communications device or exchanges signals with said communications device over a transmission medium, and said communications device is one or more of: a component in a Cable Television (CATV) system, a device performing full duplex (FDX) Data Over Cable Service Interface Specifications (DOCSIS) operations, a cellular backhaul, and a Wi-Fi repeater.

14. A method for increasing an analog to digital converter (ADC) dynamic range for a communications device, comprising:
in the communications device, establishing a reference threshold for a peak to average power ratio (PAPR) improvement factor for RF signals received by the communications device;
a peak amplitude separation element evaluating an absolute value of a portion of a particular RF signal against said reference threshold;
upon the peak amplitude separation element determining that the portion is smaller than said reference threshold, the peak amplitude separation element assigning a zero value to a DAC signal current sample; and
upon the peak amplitude separation element determining that the portion is larger or equal to said reference threshold, the peak amplitude separation element assigning a quantized value of the sample to the DAC signal current sample.

15. The method of claim 14, wherein the communications device is deployed in a Cable Television (CATV) system.

16. The method of claim 14, wherein the communications device performs full duplex (FDX) Data Over Cable Service Interface Specifications (DOCSIS) operations.

17. The method of claim 14, wherein the communications device is a point-to-point wireless link.

18. The method of claim 14, wherein the communications device is a cellular backhaul.

19. The method of claim 14, wherein the communications device is a Wi-Fi repeater.

20. The method of claim 14, wherein the apparatus is coupled to said communications device or exchanges signals with said communications device over a transmission medium, and said communications device is one or more of: a component in a Cable Television (CATV) system, a device performing full duplex (FDX) Data Over Cable Service Interface Specifications (DOCSIS) operations, a cellular backhaul, and a Wi-Fi repeater.

* * * * *